United States Patent
Hata

(10) Patent No.: US 7,554,124 B2
(45) Date of Patent: Jun. 30, 2009

(54) NITRIDE-BASED COMPOUND SEMICONDUCTOR LIGHT EMITTING DEVICE, STRUCTURAL UNIT THEREOF, AND FABRICATING METHOD THEREOF

(75) Inventor: Toshio Hata, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 23 days.

(21) Appl. No.: 11/219,139

(22) Filed: Sep. 1, 2005

(65) Prior Publication Data

US 2006/0043387 A1    Mar. 2, 2006

(30) Foreign Application Priority Data

Sep. 2, 2004  (JP) .................. 2004-255953

(51) Int. Cl.
  *H01L 33/00* (2006.01)
(52) U.S. Cl. ............................. 257/79; 257/13; 257/80; 257/85; 257/89; 257/100; 257/101; 257/103; 257/E51.018; 257/E51.022; 257/E33.001; 257/E33.077; 257/E33.054; 257/E25.032; 257/E25.028
(58) Field of Classification Search ................. 257/13, 257/79–103, E51.018, E51.022, E33.001, 257/E33.054, E25.032, E25.028
See application file for complete search history.

(56) References Cited

U.S. PATENT DOCUMENTS

| | | | |
|---|---|---|---|
| 4,605,942 A | 8/1986 | Camlibel et al. | |
| 6,169,294 B1 * | 1/2001 | Biing-Jye et al. | 257/79 |
| 6,177,352 B1 * | 1/2001 | Schonfeld et al. | 438/701 |
| 6,197,609 B1 | 3/2001 | Tsutsui | |
| 6,201,264 B1 * | 3/2001 | Khare et al. | 257/97 |
| 6,320,206 B1 | 11/2001 | Coman | |
| 6,448,102 B1 | 9/2002 | Kneissl et al. | |
| 6,562,648 B1 | 5/2003 | Wong | |
| 6,573,537 B1 * | 6/2003 | Steigerwald et al. | 257/103 |
| 6,613,461 B1 | 9/2003 | Sugahara | |
| 6,723,165 B2 | 4/2004 | Ogawa et al. | |
| 6,727,518 B2 | 4/2004 | Uemura | |
| 6,800,500 B2 * | 10/2004 | Coman et al. | 438/22 |
| 6,967,117 B2 | 11/2005 | Horng | |
| 7,019,323 B2 | 3/2006 | Shakuda | |

(Continued)

FOREIGN PATENT DOCUMENTS

JP      09-008403 A    1/1997

(Continued)

OTHER PUBLICATIONS

U.S. Office Action dated Feb. 23, 2007, directed to related U.S. Appl. No. 11/178,201.

(Continued)

*Primary Examiner*—Marcos D. Pizarro
*Assistant Examiner*—Marc Armand
(74) *Attorney, Agent, or Firm*—Morrison & Foerster LLP

(57) ABSTRACT

A nitride-based compound semiconductor light emitting device includes a first conductive substrate, a first ohmic electrode formed on the first conductive substrate, a bonding metal layer formed on the first ohmic electrode, a second ohmic electrode formed on the bonding metal layer, and a nitride-based compound semiconductor layer formed on the second ohmic electrode. The nitride-based compound semiconductor layer includes at least a P-type layer, a light emitting layer and an N-type layer, and has a concave groove portion or a concave-shaped portion.

9 Claims, 5 Drawing Sheets

U.S. PATENT DOCUMENTS

| | | | |
|---|---|---|---|
| 2002/0134987 A1* | 9/2002 | Takaoka | 257/98 |
| 2005/0104081 A1 | 5/2005 | Kim | |
| 2005/0199885 A1* | 9/2005 | Hata et al. | 257/79 |
| 2005/0242361 A1 | 11/2005 | Bessho et al. | |
| 2006/0006398 A1 | 1/2006 | Hata | |
| 2006/0017060 A1 | 1/2006 | Chen | |
| 2006/0043387 A1 | 3/2006 | Hata | |
| 2006/0043405 A1 | 3/2006 | Hata | |
| 2006/0046328 A1 | 3/2006 | Raffetto | |
| 2006/0145159 A1 | 7/2006 | Yokoyama | |
| 2006/0151801 A1 | 7/2006 | Doan | |
| 2006/0226434 A1 | 10/2006 | Hata | |
| 2006/0231852 A1 | 10/2006 | Kususe | |

FOREIGN PATENT DOCUMENTS

| | | |
|---|---|---|
| JP | 2000-252224 | 9/2000 |
| JP | 2003-347587 | 12/2003 |
| JP | 2004-72052 | 3/2004 |
| JP | 2004-266240 A | 9/2004 |
| JP | 2005-311034 | 11/2005 |
| JP | 2006-049871 | 2/2006 |
| JP | 2006-073619 | 3/2006 |
| JP | 2006-073822 | 3/2006 |

OTHER PUBLICATIONS

U.S. Office Action dated Apr. 18, 2007, directed to related U.S. Appl. No. 11/216,547.

U.S. Office Action dated Jan. 23, 2008 directed to related U.S. Appl. No. 11/178,201.

U.S. Office Action dated Mar. 18, 2008, directed to related U.S. Appl. No. 11/403,511. (6 pages).

U.S. Office Action mailed on Sep. 25, 2008, directed towards U.S. Appl. No. 11/403,511; 5 pages.

U.S. Office Action mailed on Nov. 28, 2008, directed towards U.S. Appl. No. 11/928,693; 10 pages.

* cited by examiner

NITRIDE-BASED COMPOUND SEMICONDUCTOR LIGHT EMITTING DEVICE, STRUCTURAL UNIT THEREOF, AND FABRICATING METHOD THEREOF

This nonprovisional application is based on Japanese Patent Application No. 2004-255953 filed with the Japan Patent Office on Sep. 2, 2004, the entire contents of which are hereby incorporated by reference.

BACKGROUND OF THE INVENTION

1. Field of the Invention

The present invention relates to a nitride-based compound semiconductor light emitting device capable of emitting light in the red to ultraviolet range, a structural unit thereof, and a fabricating method thereof. More particularly, the present invention relates to a nitride-based compound semiconductor light emitting device having a conductive substrate bonded thereto and having a concave groove portion, a structural unit thereof, and a fabricating method thereof.

2. Description of the Background Art

A nitride-based compound semiconductor, represented by $In_xGa_yAl_zN$ ($x+y+z=1$, $0 \leq x < 1$, $0 < y \leq 1$, $0 \leq z < 1$), for example, has a large energy bandgap and high thermal stability, and allows control of the bandgap width by adjusting composition thereof. Accordingly, the nitride-based compound semiconductor has attracted attention as a material that can be applied to various kinds of semiconductor devices, such as a light emitting device, a high-temperature device and others.

In particular, as for a light emitting diode using the nitride-based compound semiconductor, a device having luminous intensity of some cd grades in the blue to green wavelength range has already been developed and brought to practical use. As for a pickup light source for large-capacity optical disk media, practical application of a laser diode using the nitride-based compound semiconductor is becoming an objective of research and development.

Japanese Patent Laying-Open No. 09-008403 discloses a device structure of such a laser or light emitting diode. Specifically, as shown in FIG. 7, on a conductive substrate 100 having a positive electrode 107 formed, a first ohmic electrode 102 and a second ohmic electrode 101 are formed. A P-type layer 103 of gallium nitride-based semiconductor, an active layer 104 and an N-type layer 105 are stacked successively thereon, and a negative electrode 106 is formed further thereon. Here, first ohmic electrode 102 and second ohmic electrode 101 are bonded together by hot pressure bonding.

As such, in the conventional technique as described in Japanese Patent Laying-Open No. 09-008403, an ohmic electrode is formed on a conductive substrate, and hot pressure bonding or the like is used for bonding of the gallium nitride-based semiconductor layer.

With such a technique, however, it was difficult to uniformly heat and pressure bond the entire surface of the large-area conductive substrate to the entire surface of the nitride-based compound semiconductor layer via the ohmic electrode and the bonding metal layer. Thus, adhesion between the conductive substrate and the nitride-based compound semiconductor layer was poor, resulting in peeling of the entire surfaces thereof.

Further, the conductive substrate would peel off from the ohmic electrode due to poor adhesion therebetween. If the conductive substrate and the ohmic electrode are separated from each other completely, it is not possible to remove a sapphire substrate, hindering formation of a light emitting device. If they are partially separated from each other, flow of the current from the gallium nitride-based semiconductor layer to the conductive substrate will be difficult, leading to an increase of operating voltage, thereby causing degradation in reliability of the light emitting device.

Further, if partial peeling occurs, the support substrate may be separated from the nitride-based compound semiconductor layer upon cutting of the wafer into chips, leading to degradation in yield of the fabrication process.

Still further, the partially peeled-off state will cause penetration of solvent, resist, or etchant during the process. For example, upon fabrication of a lamp light emitting device, resin, water or the like will enter through the peeled-off part, which will expand the peeling, possibly destroying the ohmic electrode and the bonding metal layer. This would degrade reliability of the light emitting device.

Still further, when Au wire is bonded to a pad electrode, if adhesion between the conductive substrate and the ohmic electrode formed thereon is poor, there will occur peeling of the conductive substrate from the ohmic. electrode, thereby causing an increase of operating voltage.

SUMMARY OF THE INVENTION

The present invention has been made to solve the conventional technical problems described above. An object of the present invention is to improve adhesion between a bonding metal layer and an ohmic electrode as well as adhesion between a conductive substrate and the ohmic electrode, to provide a nitride-based compound semiconductor light emitting device that is highly reliable and ensures a good yield, a structural unit thereof, and a fabricating method thereof.

According to an aspect of the present invention, a nitride-based compound semiconductor light emitting device includes: a first conductive substrate; a first ohmic electrode formed on the first conductive substrate; a bonding metal layer formed on the first ohmic electrode; a second ohmic electrode formed on the bonding metal layer; and a nitride-based compound semiconductor layer formed on the second ohmic electrode. The nitride-based compound semiconductor layer includes at least a P-type layer, a light emitting layer and an N-type layer, and has a concave groove portion or a concave-shaped portion.

Preferably, the first conductive substrate has a concave groove portion.

Preferably, the first conductive substrate is a semiconductor of at least one kind of material selected from the group consisting of Si, GaAs, GaP, Ge and InP.

Preferably, the nitride-based compound semiconductor layer is formed using a second substrate, and the second substrate is an insulative substrate of sapphire, spinel or lithium niobate, or a conductive substrate of silicon carbide, silicon, zinc oxide or gallium arsenide.

Preferably, the bonding metal layer includes a first bonding metal layer and a second bonding metal layer.

Preferably, the bonding metal layer includes at least two layers formed of different materials from each other or formed of the same material.

According to another aspect of the present invention, a nitride-based compound semiconductor light emitting device structural unit includes a nitride-based compound semiconductor layer having a buffer layer, an N-type layer, a light emitting layer and a P-type layer successively formed on a second substrate, wherein the nitride-based compound semiconductor layer has a concave groove portion. Here, the concave groove portion may also be formed in the second substrate.

Preferably, the second substrate is an insulative substrate of sapphire, spinel or lithium niobate, or a conductive substrate of silicon carbide, silicon, zinc oxide or gallium arsenide.

Preferably, a second ohmic electrode is further formed on the nitride-based compound semiconductor layer.

According to a further aspect of the present invention, a nitride-based compound semiconductor light emitting device has a first conductive substrate and the above-described nitride-based compound semiconductor light emitting device structural unit integrated into one piece via a bonding metal layer such that the nitride-based compound semiconductor layer and the first conductive substrate are adjacent to each other.

Preferably, the first conductive substrate has a concave groove portion.

According to yet another aspect of the present invention, a fabricating method of a nitride-based compound semiconductor light emitting device includes: the step of forming a nitride-based compound semiconductor layer on a second substrate; the step of forming a concave groove portion in the nitride-based compound semiconductor layer; the step of forming a second ohmic electrode on the nitride-based compound semiconductor layer having the concave groove portion; the step of forming a second bonding metal layer on the second ohmic electrode; the step of forming a first ohmic electrode on a first conductive substrate; the step of forming a first bonding metal layer on the first ohmic electrode; the step of bonding the first bonding metal layer to the second bonding metal layer; the step of removing the second substrate to expose a surface of the nitride-based compound semiconductor layer; and the step of forming a transparent electrode on the exposed surface.

According to still another aspect of the present invention, a fabricating method of a nitride-based compound semiconductor light emitting device includes: the step of forming a nitride-based compound semiconductor layer on a second substrate; the step of forming a concave groove portion in the nitride-based compound semiconductor layer; the step of forming a second ohmic electrode on the nitride-based compound semiconductor layer having the concave groove portion; the step of forming a second bonding metal layer on the second ohmic electrode; the step of forming a concave groove portion in a first conductive substrate; the step of forming a first ohmic electrode on the first conductive substrate having the concave groove portion; the step of forming a first bonding metal layer on the first ohmic electrode; the step of bonding the first bonding metal layer to the second bonding metal layer; the step of removing the second substrate to expose a surface of the nitride-based compound semiconductor layer; and the step of forming a transparent electrode on the exposed surface.

Preferably, the step of forming the nitride-based compound semiconductor layer on the second substrate includes the step of stacking at least an N-type layer, a light emitting layer and a P-type layer successively in this order from the second substrate side.

Preferably, the fabricating method further includes the step of forming a reflecting layer on the second ohmic electrode between the step of forming the second ohmic electrode and the step of forming the second bonding metal layer, and the step of forming the second bonding metal layer includes the step of forming the second bonding metal layer on the reflecting layer.

According to the present invention, a concave groove portion is formed on the second substrate, and another concave groove portion is optionally formed in the first conductive substrate, and at least one of the bonding metal layers is formed to have a reduced area for bonding. This ensures good adhesion between the first conductive substrate and the second substrate. With such good adhesion, an operating voltage of the light emitting device is reduced, and accordingly, a nitride-based compound semiconductor light emitting device that is highly reliable and produces high optical output can be provided. Dividing into the light emitting devices is also facilitated, and the process yield of the nitride-based compound semiconductor light emitting devices is improved as well.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The nitride-based compound semiconductor light emitting device of the present invention includes a first conductive substrate, a first ohmic electrode formed on the first conductive substrate, a bonding metal layer formed on the first ohmic electrode, a second ohmic electrode formed on the bonding metal layer, and a nitride-based compound semiconductor layer formed on the second ohmic electrode. The nitride-based compound semiconductor layer includes at least a P-type layer, a light emitting layer and an N-type layer, and has a concave groove portion or a concave-shaped portion.

Since the concave groove portion is formed in the nitride-based compound semiconductor layer, the area for bonding of the bonding metal layer can be decreased. This provides close contact between the bonding metal layers, and as a result, good adhesion between the first conductive substrate and the nitride-based compound semiconductor layer is ensured. Here, the concave groove portion refers to a concave shape having a recess or depression, which is not restricted to a groove.

Figure 1:
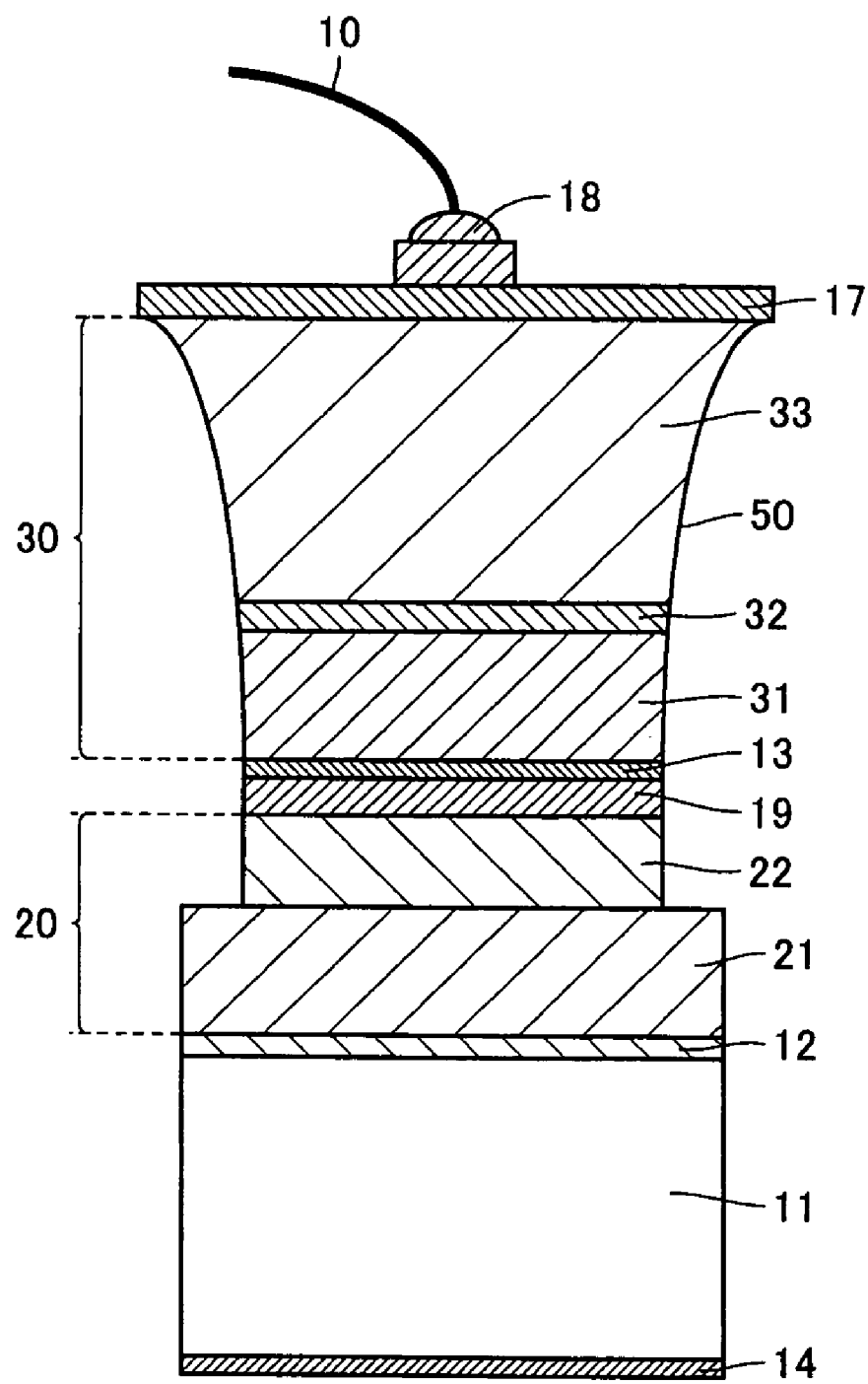
FIG. 1 is a schematic cross sectional view of a nitride-based compound semiconductor light emitting device according to the present invention.

Hereinafter, the present invention will be described in detail with reference to the drawings. FIG. 1 is a schematic cross sectional view of a nitride-based compound semiconductor light emitting device of the present invention. The nitride-based compound semiconductor light emitting device of the present invention includes a first ohmic electrode 12 formed on a first conductive substrate 11, a bonding metal layer 20 formed on first ohmic electrode 12, a second ohmic electrode 13 formed on bonding metal layer 20, a nitride-based compound semiconductor layer 30 formed on second ohmic electrode 13, a transparent electrode 17 formed on nitride-based compound semiconductor layer 30, and a pad electrode 18 formed on transparent electrode 17. A concave groove portion 50 is formed in nitride-based compound semiconductor layer 30, which reduces the area of bonding metal layer 20 in contact with nitride-based compound semiconductor layer 30, whereby good adhesion with first conductive substrate 11 is ensured.

In FIG. 1, nitride-based compound semiconductor layer 30 is formed of a P-type layer 31, a light emitting layer 32 and an N-type layer 33 stacked in this order from the first conductive substrate 11 side, to make it function as a light emitting device. Bonding metal layer 20 is formed of a first bonding metal layer 21 and a second bonding metal layer 22.

Preferably, in the nitride-based compound semiconductor light emitting device of FIG. 1, an ohmic electrode 14 is further formed on a back face of first conductive substrate 11, and wire bonding 10 is formed on pad electrode 18. Still preferably, a reflecting layer 19 is formed between second ohmic electrode 13 and second bonding metal layer 22. In FIG. 1, concave groove portion 50 is formed to extend to reflecting layer 19 and second bonding metal layer 22. Specifically, in the fabricating process of the relevant light emitting device, reflecting layer 19 and second bonding metal layer 22 are formed on P-type layer 31 after forming concave groove portion 50 in nitride-based compound semiconductor layer 30, so that reflecting layer 19 and second bonding metal layer 22 maintain the concave groove portion of semiconductor layer 30.

In the present invention, Si, GaAs, GaP, Ge or InP may be used for first conductive substrate 11. In this case, resistivity of the first conductive substrate is preferably in the range of not lower than $10^{-4}$ Ωcm and not greater than 10 Ωcm. A substrate having the resistivity of lower than $10^{-4}$ Ωcm is difficult to fabricate. If it exceeds 10 Ωcm, ohmic contact with the ohmic electrode will be degraded to cause a voltage increase, leading to an increase of the driving voltage of the light emitting device. The resistivity is more preferably in the range of not lower than $10^{-3}$ Ωcm and not greater than $10^{-2}$ Ωcm.

First conductive substrate 11 preferably has a thickness of not less than 50 μm and not more than 500 μm. If it exceeds 500 μm, dividing into chips may be difficult. If it is less than 50 μm, handling of chips will be difficult.

In the present invention, Al, Cr, Ti, In, or Ti—Al may be used for the first ohmic electrode, although not restricted thereto.

In the present invention, the bonding metal layer is provided to ensure good adhesion between the first and second ohmic electrodes, as will be described later. As the bonding metal layer, Au, Sn, Au—Sn, Au—Si or Au—Ge may be used. In the case of the bonding metal layer formed of two or more layers, same or different materials may be used for the layers, or same or different materials selected from the above materials may be combined as appropriate for the respective layers.

Here, the case of the bonding metal layer formed of two or more layers may include the cases as follows. In the process of forming a bonding metal layer, a first bonding metal layer is formed in advance on the first ohmic electrode, and a second bonding metal layer is formed in advance on the second ohmic electrode, and the first and second bonding metal layers are bonded together, in which case the bonding metal layer consists of two layers. Another example is the case where each of the first and second bonding metal layers before bonding is formed of a plurality of layers.

In the present invention, Pd, Pt, Ni, Au or Ni—Au may be used for the second ohmic electrode, although not restricted thereto. The second ohmic electrode preferably has a thickness of not less than 1 nm and not more than 15 nm. If it exceeds 15 nm, transmission of emitted light may become insufficient. If it is less than 1 nm, ohmic contact may be degraded.

In the present invention, the nitride-based compound semiconductor can emit light in the red to ultraviolet range. Such a nitride-based compound semiconductor may be $In_xAl_yGa_{1-x-y}N$ (0≦x, 0≦y, x+y≦1), although not restricted thereto. The nitride-based compound semiconductor layer of the present invention includes an N-type layer, a light emitting layer and a P-type layer from the side of a second substrate, which will be described later. The N-type layer, the light emitting layer and the P-type layer may be fabricated using any of known methods, which may include metallorganic chemical vapor deposition (MOCVD), molecular beam epitaxy (MBE) and others.

In the present invention, a concave groove portion is formed after fabrication of the above-described nitride-based compound semiconductor layer. Reactive ion etching (RIE) may be used to form the concave groove portion, to have a width of preferably in the range of not less than 1 μm and not more than 100 μm. If it exceeds 100 μm, the number of chips obtainable may decrease. If it is less than 1 μm, dividing into chips may be difficult. In terms of depth, the concave groove portion is preferably formed to reach the second substrate or to extend to the middle of the second substrate, as will be described later.

In the present invention, the nitride-based compound semiconductor layer is made into a nitride-based compound semiconductor light emitting device structural unit before being bonded to the first bonding metal layer, i.e., before being bonded to the first conductive substrate, by stacking a buffer layer, an N-type layer, a light emitting layer and a P-type layer in this order on the second substrate.

Figure 2:
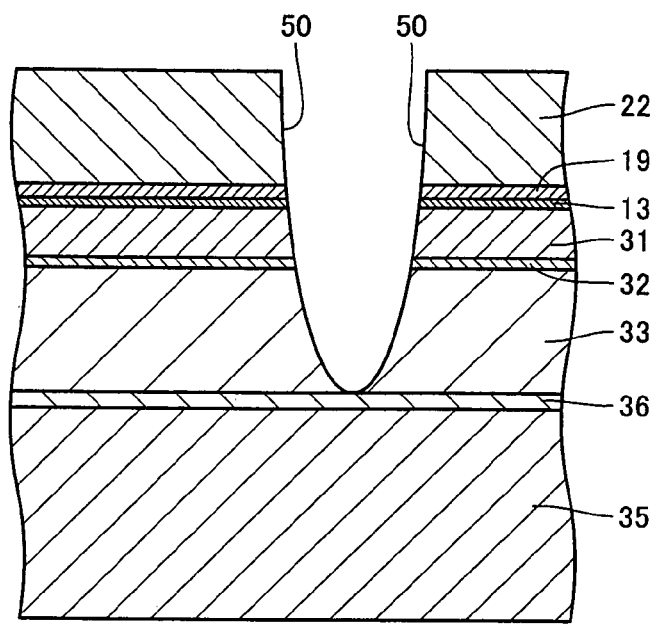
FIG. 2 is a schematic cross sectional view of a nitride-based compound semiconductor light emitting device structural unit according to the present invention.

More specifically, as shown in FIG. 2, a buffer layer 36, an N-type layer 33, a light emitting layer 32 and a P-type layer 31 are stacked in this order on a second substrate 35, to form a nitride-based compound semiconductor layer. Then, a concave groove portion 50 is formed in the nitride-based compound semiconductor layer to reach buffer layer 36 or to extend to the middle of the second substrate, to thereby attain a nitride-based compound semiconductor light emitting device structural unit. Thereafter, on the part of the P-type layer not provided with the concave groove portion 50, a second ohmic electrode 13, a reflecting layer 19, a barrier layer (not shown), and a second bonding metal layer 22 are formed in this order by evaporation or the like. Then, second bonding metal layer 22 within the structural unit is bonded to first bonding metal layer 21.

In this manner, by forming the nitride-based compound semiconductor light emitting device structural unit in advance, good adhesion between the nitride-based compound semiconductor layer and the first conductive substrate is ensured. Further, formation of the concave groove portion in the nitride-based compound semiconductor layer is facilitated. Still further, electrodes can be formed on the opposite sides of the semiconductor light emitting device.

The second substrate may be an insulative substrate such as sapphire, spinel or lithium niobate, or may be a conductive substrate such as silicon carbide, silicon, zinc oxide or gallium arsenide. The substrate can be removed by grinding, polishing or laser lift-off.

The reflecting layer is for reflecting the light from the light emitting layer upward. The reflecting layer may be formed of Ag, Al, or a rare-earth element (Nd or the like) mixed with Ag, although not restricted thereto.

The barrier layer is for preventing the bonding metal from entering the reflecting layer. The barrier layer may be formed of Mo, Ni, Ti, or Ni—Ti, although not restricted thereto. The barrier layer preferably has a thickness of not less than 5 nm.

If it is less than 5 nm, the thickness of the barrier layer may become uneven, in which case the bonding metal may enter the reflecting layer through the region where the barrier layer is not formed.

In the present invention, the transparent electrode may be formed of Pd, Ni or Ni—Au, and may have a thickness of not less than 1 nm and not more than 15 nm. If it exceeds 15 nm, emitted light may not be transmitted. If it is less than 1 nm, ohmic contact may be degraded.

In the present invention, the above-described nitride-based compound semiconductor light emitting device structural unit may be bonded via the bonding metal layer, i.e., it may be bonded to the first bonding metal layer formed on the first conductive substrate, to combine the first conductive substrate and the nitride-based compound semiconductor layer to thereby obtain a nitride-based compound semiconductor light emitting device. For the bonding described above, eutectic bonding can be employed, which may be carried out under the conditions of a temperature in the range of about 250° C. to about 320° C., and a pressure in the range of about 200 N to about 3000 N.

In the present invention, a concave groove portion may be formed in the first conductive substrate as well, for which etching may be employed. The concave groove portion preferably has a width of not less than 2 μm and not more than 150 μm. If it exceeds 150 μm, the first conductive substrate may not be able to support the nitride-based compound semiconductor light emitting device structural unit. If it is less than 2 μm, it may be difficult to form the concave groove portion opposite to the concave groove portion formed in the nitride-based compound semiconductor light emitting device structural unit. For etching, a hydrofluoric acid-based etchant, or a halogen-based gas for dry etching may be employed.

In the present invention, when bonding the first conductive substrate and the nitride-based compound semiconductor layer into one piece, a concave groove portion may be formed in the first conductive substrate before being bonded to the nitride-based compound semiconductor layer, as described above. When the concave groove portions are formed in both of the first conductive substrate and the nitride-based compound semiconductor layer, the area for bonding is further reduced, whereby more reliable adhesion is ensured.

Hereinafter, a fabricating method of a nitride-based compound semiconductor light emitting device of the present invention will be described. The fabricating method of a nitride-based compound semiconductor light emitting device of the present invention includes the step of forming a nitride-based compound semiconductor layer on a second substrate, the step of forming a concave groove portion in the nitride-based compound semiconductor layer, the step of forming a second ohmic electrode on the nitride-based compound semiconductor layer having the concave groove portion, the step of forming a second bonding metal layer on the second ohmic electrode, the step of forming a first ohmic electrode on a first conductive substrate, the step of forming a first bonding metal layer on the first ohmic electrode, the step of bonding the first and second bonding metal layers together, the step of removing the second substrate to expose a surface of the nitride-based compound semiconductor layer, and the step of forming a transparent electrode on the exposed surface.

Figure 3:
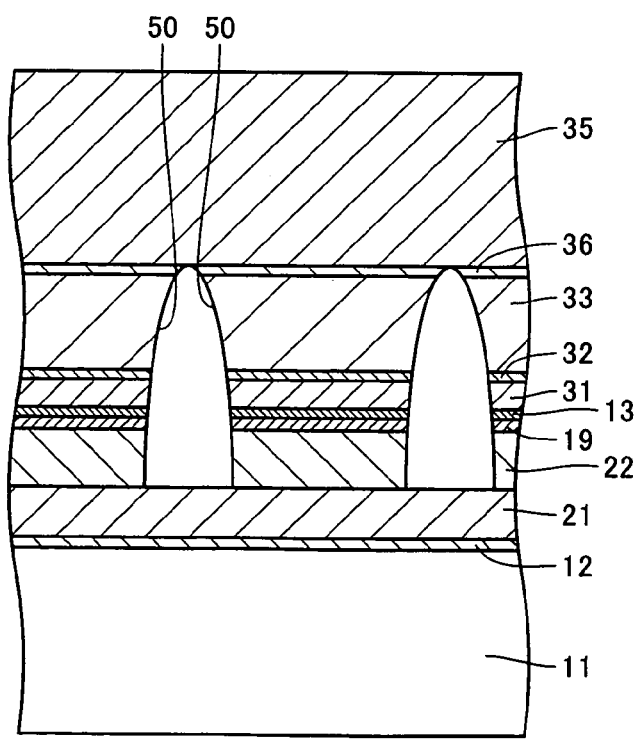
FIG. 3 is a schematic cross sectional view illustrating the state where first and second bonding metal layers are bonded to each other to combine a structure of the second substrate side and a structure of the first conductive substrate side into one piece.

The fabricating method of the present invention is characterized in that the nitride-based compound semiconductor layer having the concave groove portion, the second ohmic electrode and the second bonding metal layer are formed in advance on the second substrate, and this structure is bonded to the structure on the first conductive substrate side including the first conductive substrate, the first ohmic electrode and the first bonding metal layer, as explained above. FIG. 3 shows the state where the structure on the second substrate side and the structure on the first conductive substrate side are integrated into one piece with the first and second bonding metal layers bonded to each other.

In this manner, by forming the concave groove portion in the nitride-based compound semiconductor layer, the area for bonding can be reduced, whereby good adhesion between the nitride-based compound semiconductor layer and the first conductive substrate is ensured. Further, the electrodes can be formed at the top and the bottom of the device, being bonded together via the bonding metal layers. This prevents peeling of the ohmic electrodes and ensures good adhesion. Accordingly, a highly reliable light emitting device can be obtained.

Further, in the fabricating method of the present invention, second substrate 35 is removed after the structure on the first conductive substrate side and the structure on the second substrate side are integrated into one piece as shown in FIG. 3. When second substrate 35 is removed, concave groove portion 50 having been formed in advance can separate the device structures, which simplifies the light emitting device dividing process. Thereafter, a scribe line is introduced into the first conductive substrate, in a position corresponding to concave groove portion 50, in the direction perpendicular to the substrate surface. The dividing process is carried out along the scribe line, and accordingly, the light emitting device of the present invention shown in FIG. 1 is fabricated.

Figure 4:
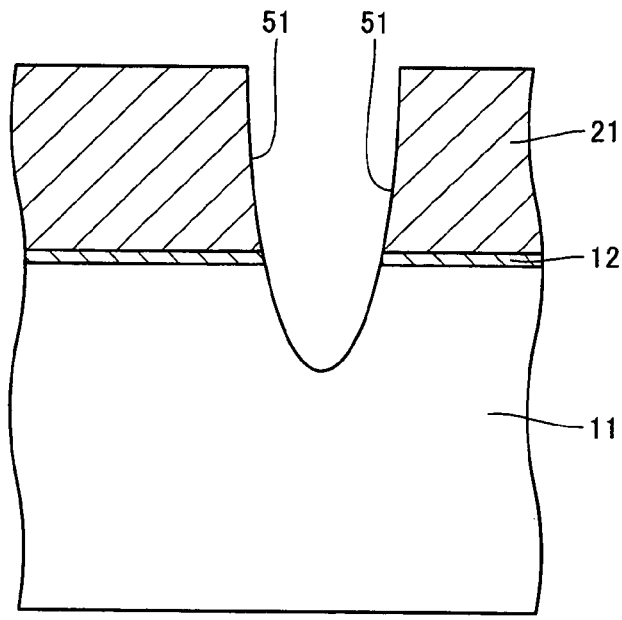
FIG. 4 is a schematic cross sectional view illustrating the state where a concave groove portion is formed in the first conductive substrate.
Figure 5:
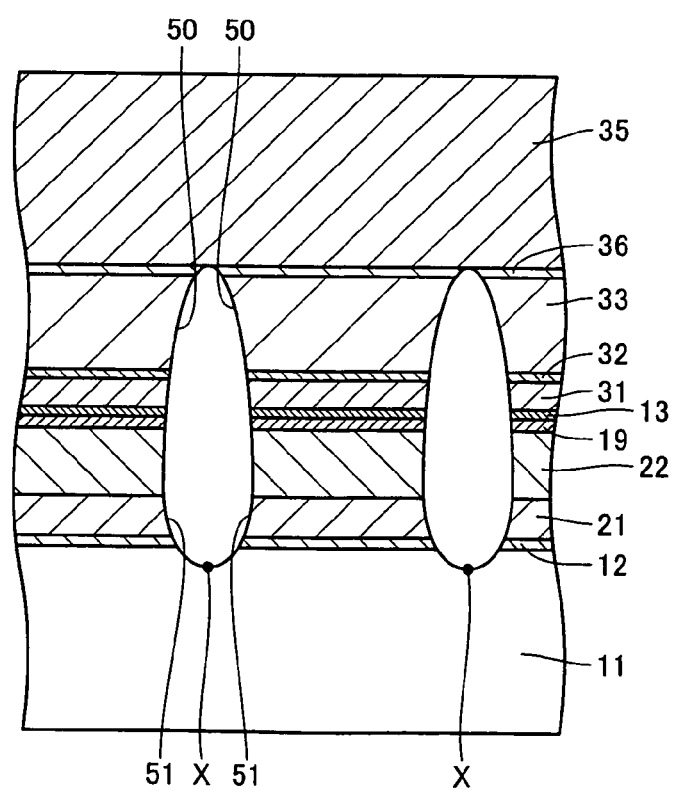
FIG. 5 is a schematic cross sectional view illustrating the state where first and second bonding metal layers are bonded to each other to combine a structure of the second substrate side and a structure of the first conductive substrate side into one piece.
Figure 6:
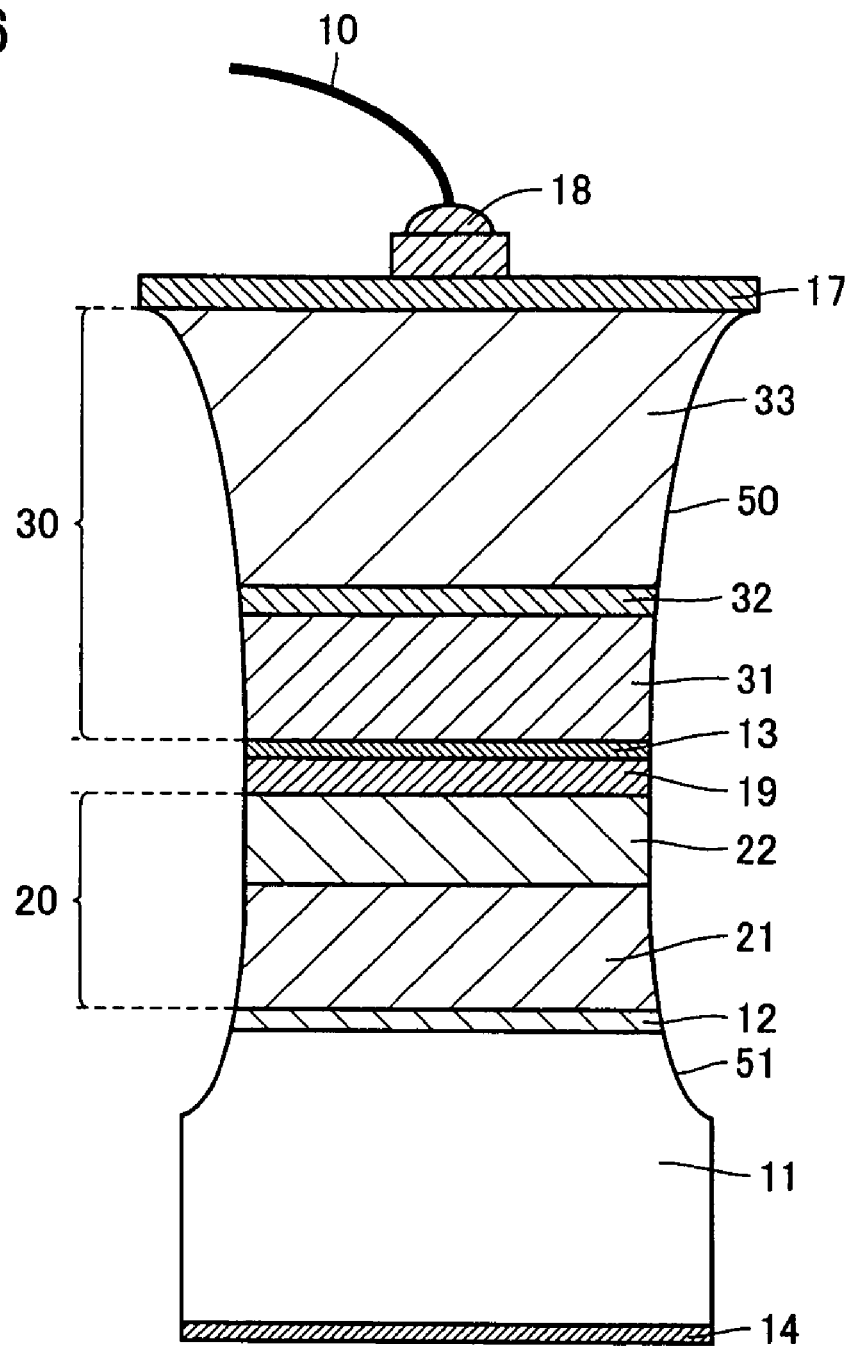
FIG. 6 is a schematic cross sectional view of a nitride-based compound semiconductor light emitting device according to the present invention.
Figure 7:
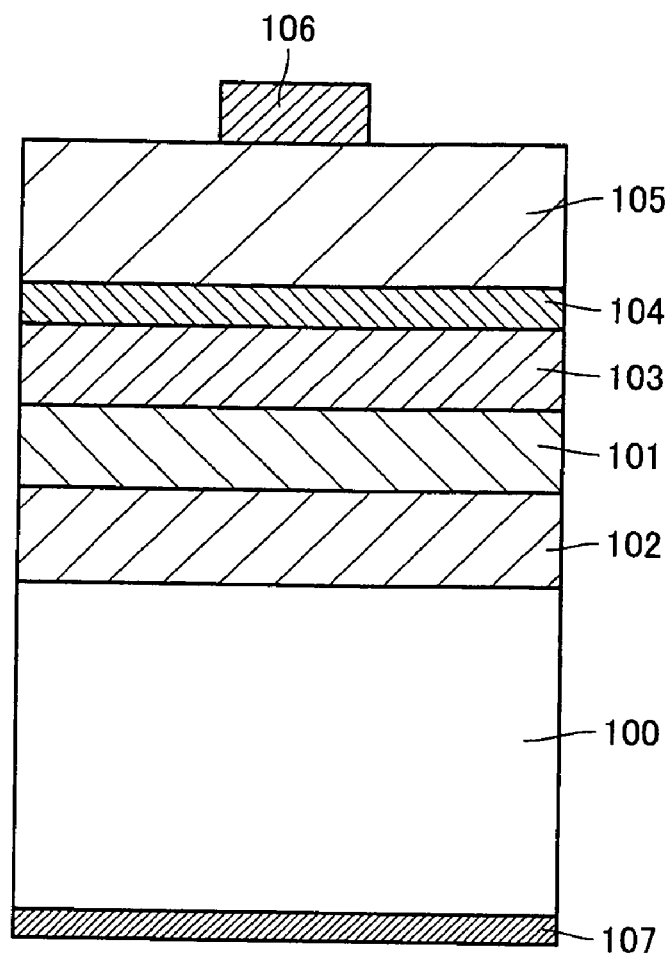
FIG. 7 is a schematic cross sectional view of a conventional nitride-based compound semiconductor light emitting device.

In the fabricating method of the present invention, it is preferable to form a concave groove portion in the first conductive substrate in advance before bonding the first and second bonding metal layers. More specifically, as shown in FIG. 4, concave groove portion 51 is formed by etching before forming first ohmic electrode 12 and first bonding metal layer 21 on first conductive substrate 11. Thereafter, as shown in FIG. 5, the structure of the second substrate side and the structure of the first conductive substrate side are integrated into one piece and the second substrate is removed, as in the case of the above-described fabrication method. Thereafter, a scribe line is introduced into the first conductive substrate, to the bottom portion X of concave groove portion 51, in the direction perpendicular to the substrate surface. The scribe line is used to divide the wafer, whereby the nitride-based compound semiconductor light emitting device as shown in FIG. 6 is obtained.

In this manner, by forming the concave groove portion in the first conductive substrate as well, the area for bonding between the first bonding metal layer and the second bonding metal layer can further be reduced in size, and accordingly, the bonding strength is further increased.

In the fabricating method of the present invention, the steps of forming the first ohmic electrode and the first bonding metal layer on the first conductive substrate may be carried out by an electron beam (EB) evaporation, sputtering, or resistive thermal evaporation. Further, the step of forming the second ohmic electrode on the nitride-based compound semiconductor layer may be carried out by EB evaporation or the like.

Further, in the fabricating method of the present invention, the first bonding metal layer and the second bonding metal layer may be bonded together by using eutectic bonding. In this case, the temperature and the pressure may be set as appropriate according to the materials being used.

Still further, the step of forming the scribe line in the first conductive substrate may be carried out by forming the scribe line from the back side of the first conductive substrate corresponding to, or opposite to, the concave groove portion, using a scriber of an infrared transmission type, in the direction perpendicular to the substrate surface. Further, the step of performing dividing along the scribe line may be carried out by breaking.

Hereinafter, the present invention will be explained in detail with reference to examples. It is noted that the present invention is not restricted thereto.

EXAMPLE 1

In the present example, a nitride-based compound semiconductor light emitting device as shown in FIG. 1 was formed, as will be explained in detail below.

On a sapphire substrate serving as second substrate 35, a buffer layer 36 made of a GaN material, an N-type nitride-based compound semiconductor layer 33, a multi-quantum well (MQW) light emitting layer 32, and a P-type nitride-based compound semiconductor layer 31 were formed successively by MOCVD. Specifically, GaN buffer layer 36 was formed to a thickness of 20 nm, N-type nitride-based compound semiconductor layer 33 was formed to a thickness of 5 μm, MQW light emitting layer 32 was formed to a thickness of 50 nm, and P-type nitride-based compound semiconductor layer 31 was formed to a thickness of 150 nm.

Next, a concave groove portion 50 was formed in the nitride-based compound semiconductor layer formed on the sapphire substrate. RIE was employed at this time. The width of the concave groove portion was set to 20 μm, and its depth was set to reach the sapphire substrate.

Thereafter, on P-type nitride-based compound semiconductor layer 31, a second ohmic electrode 13, a reflecting layer 19 and a second bonding metal layer 22 were formed in this order by evaporation. Specifically, Pd (3 nm) was formed as second ohmic electrode 13, Ag (150 nm) was formed as reflecting metal layer 19, Mo (50 nm) was formed as a barrier layer (not shown), and AuSn (3 μm) and Au (10 nm) were formed as second bonding metal layer 22, by EB evaporation. Here, Sn contained in the AuSn was 20 mass %. Au (10 nm) described above serves as an antioxidant film for the AuSn layer. In this manner, a nitride-based compound semiconductor light emitting device structural unit was formed.

Next, a first ohmic electrode 12 and a first bonding metal layer 21 were formed on a first conductive substrate 11. Specifically, Ti (15 nm)/Al (150 nm) serving as first ohmic electrode 12 were formed on first conductive substrate 11 made of a Si material, and Mo (50 nm) serving as a barrier layer (not shown) and Au (3 μm) serving as first bonding metal layer 21 were formed thereon, using EB evaporation.

Thereafter, the nitride-based compound semiconductor layer having concave groove portion 50 and the first conductive substrate were bonded together. That is, the above-described nitride-based compound semiconductor light emitting device structural unit and the first conductive substrate were integrated into one piece. More specifically, first bonding metal layer 21 made of the Au material and the Au layer on the AuSn layer of second bonding metal layer 22 were arranged opposite to each other, and eutectic bonding was carried out at a temperature of 290° C. and a pressure of 300 N to bond them together.

Thereafter, the sapphire substrate as second substrate 35 was removed. Specifically, YAG-THG laser light (of 355 nm in wavelength) was irradiated from the mirror-finished back side of the sapphire substrate, for thermal decomposition of the sapphire substrate, buffer layer 36 of the GaN material forming the interface with the sapphire substrate, and a part of N-type layer 33.

Further, a transparent electrode 17 made of ITO (Sn-doped $In_2O_3$) was formed on a part of N-type layer 33 exposed by removal of the sapphire substrate where concave groove portion 50 is not formed. An N-type bonding pad electrode 18 was formed at the center of transparent electrode 17. Au wire 10 was ball-bonded on N-type bonding pad electrode 18. An ohmic electrode 14 was further formed on the back face of first conductive substrate 11. Accordingly, the nitride-based compound semiconductor light emitting device was fabricated.

In the above description, the nitride-based compound semiconductor layer having a concave groove portion formed therein was bonded to the wafer of the first conductive substrate not having a concave groove portion. Alternatively, a concave groove portion may be formed in the first conductive substrate side, and the relevant substrate may be bonded to the wafer of the nitride-based compound semiconductor layer not having a concave groove portion.

According to Example 1, a concave groove portion is formed in the nitride-based compound semiconductor layer formed on the sapphire substrate. This can reduce the area of bonding surfaces when bonding the wafer on the first conductive substrate side with the wafer on the second substrate side, and accordingly, good adhesion between the first and second bonding metal layers formed on the respective sides is ensured. The bonding strength is increased, and close contact therebetween is further ensured. As a result, peeling of the first conductive substrate with respect to the nitride-based compound semiconductor layer is prevented, and peeling of the wafers upon chip dividing is reduced. Accordingly, with the increased yield in the process, an inexpensive nitride-based compound semiconductor light emitting device can be provided. Further, provision of the concave groove portion in the nitride-based compound semiconductor layer enables division of the nitride-based compound semiconductor layer by only the removal of the sapphire substrate, whereby chip dividing is further facilitated.

EXAMPLE 2

In the present example, a nitride-based compound semiconductor light emitting device as shown in FIG. 6 was fabricated, as described in detail in the following.

On a sapphire substrate serving as second substrate 35, a buffer layer 36 made of a GaN material, an N-type nitride-based compound semiconductor layer 33, a MQW light emitting layer 32, and a P-type nitride-based compound semiconductor layer 31 were formed successively, by MOCVD. Specifically, on the sapphire substrate, GaN buffer layer 36 was formed to a thickness of 30 nm, N-type nitride-based compound semiconductor layer 33 was formed thereon to a thickness of 5 μm, MQW light emitting layer 32 was formed thereon to a thickness of 50 nm, and P-type nitride-based compound semiconductor layer 31 was formed thereon to a thickness of 200 nm.

Next, a concave groove portion 50 was formed in the nitride-based compound semiconductor layer on the sapphire substrate, using RIE. The concave groove portion was made in a width of 20 μm and in a depth reaching the sapphire substrate.

Next, on the surface of P-type nitride-based compound semiconductor layer 31 except for concave groove portion 50, a second ohmic electrode 13, a reflecting metal layer 19, and a second bonding metal layer 22 were formed by EB evaporation. Specifically, Pd was formed to a thickness of 3 nm as second ohmic electrode 13, Ag—Nd was formed to a thickness of 150 nm as reflecting metal layer 19, Mo was formed to a thickness of 50 nm as a barrier layer (not shown), and AuSn and Au were formed to thicknesses of 3 μm and 10 nm, respectively, as second bonding metal layer 22. Here, Sn contained in AuSn was 20 mass %. Au described above serves as an antioxidant film for AuSn. In this manner, a nitride-based compound semiconductor light emitting device structural unit was fabricated.

Next, on a first conductive substrate 11 made of a Si material having a concave groove portion 51, a first ohmic electrode 12 and a first bonding metal layer 21 were formed using EB evaporation. Specifically, concave groove portion 51 was formed to a certain depth in first conductive substrate 11, with a width of 20 μm, using a hydrofluoric acid-based etchant. Further, on the surface of the Si substrate except for concave groove portion 51, Ti (15 nm)/Al (150 nm) were formed as first ohmic electrode 12, Mo was formed to a thickness of 50 nm as a barrier layer (not shown), and Au was formed to a thickness of 3 μm as first bonding metal layer 21.

Thereafter, the structure on the nitride-based compound semiconductor layer side having concave groove portion 50 and the structure on the first conductive substrate side having concave groove portion 51 were integrated into one piece by bonding the first and second bonding metal layers together. That is, the nitride-based compound semiconductor light emitting device structural unit was bonded with the structure on the first conductive substrate side. Specifically, the above-described Au layer 21 and the Au layer 22 on the above-described AuSn layer were arranged opposite to each other, and eutectic bonding was carried out at a temperature of 290° C. and a pressure of 200 N to bond them.

Next, the sapphire substrate was removed. Specifically, YAG-THG laser light (of 355 nm in wavelength) was irradiated from the mirror-finished back side of the sapphire substrate, for thermal decomposition of the sapphire substrate, the buffer layer forming the interface with the sapphire substrate, and a part of the N-type layer, to thereby remove the sapphire substrate.

Thereafter, a transparent electrode 17 of ITO (Sn-doped $In_2O_3$) was formed on the approximately entire surface of N-type layer 33 exposed by removal of the sapphire substrate. An N-type bonding pad electrode 18 was formed at the center thereof. Au wire 10 was ball-bonded on N-type bonding pad electrode 18. Accordingly, the nitride-based compound semiconductor light emitting device was obtained.

Here, although transparent electrode 17 was formed over the approximately entire surface of N-type layer 33, it may be a branch-shaped electrode. Alternatively, the N-type bonding pad electrode alone may be provided.

In the present example, the concave groove portion is formed in the Si substrate, and the concave groove portion is also formed on the sapphire substrate on which the nitride-based compound semiconductor layer is stacked. This can further reduce the area of bonding surfaces when bonding the device structures, compared to the case of Example 1, and further improves adhesion of the bonding metal layers formed on the Si substrate and the sapphire substrate. Accordingly, the bonding strength is further increased, and more favorable adhesion is ensured. As a result, the peeling of the Si substrate with respect to the nitride-based compound semiconductor layer is prevented, and the peeling of the wafers upon the chip dividing process is reduced. Accordingly, the yield in the process is improved, and an inexpensive nitride-based compound semiconductor light emitting device can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride-based compound semiconductor light emitting device, comprising:
   a first conductive substrate;
   a first ohmic electrode formed on the first conductive substrate;
   a first bonding metal layer formed on the first ohmic electrode;
   a second bonding metal layer bonded to the first bonding metal layer;
   a second ohmic electrode formed on the second bonding metal layer; and
   a nitride-based compound semiconductor layer formed on the second ohmic electrode,
   wherein the nitride-based compound semiconductor layer comprises a P-type layer, a light emitting layer and an N-type layer; and
   a concave groove portion or a concave-shaped portion formed in each of two opposing side surfaces of the nitride-based compound semiconductor light emitting device, the concave groove portion or the concave-shaped portion extending at least from the nitride-based compound semiconductor layer to the second bonding metal layer such that a surface area of said nitride-based compound semiconductor layer on a side of said second ohmic electrode is smaller than a surface area on a side opposite to said second ohmic electrode.

2. The nitride-based compound semiconductor light emitting device according to claim 1, wherein the concave groove portion or concave-shaped portion extends from the nitride-based compound semiconductor layer to the first conductive substrate.

3. The nitride-based compound semiconductor light emitting device according to claim 1, wherein said first conductive substrate is a semiconductor of at least one kind of material selected from the group consisting of Si, GaAs, GaP, Ge and InP.

4. The nitride-based compound semiconductor light emitting device according to claim 1, further comprising a second substrate formed on the nitride-based compound semiconductor,
   wherein the second substrate is an insulative substrate of sapphire, spinel or lithium niobate, or a conductive substrate of silicon carbide, silicon, zinc oxide or gallium arsenide.

5. The nitride-based compound semiconductor light emitting device according to claim 1, wherein the first bonding metal layer and the second bonding metal layer are formed of the same material.

6. The nitride based compound semiconductor light emitting device according to claim 1, wherein a side of the second bonding metal layer that bonds with the first bonding metal layer has a smaller surface area than a side of the nitride-based compound semiconductor layer opposite the second bonding metal layer.

7. The nitride-based compound semiconductor light emitting device according to claim 1, wherein a side of the first bonding metal layer that bonds with the second bonding metal layer has a larger surface area than a side of the second bonding metal layer opposite the first bonding metal layer.

8. The nitride-based compound semiconductor light emitting device according to claim 1, wherein the first bonding metal layer and the second bonding metal layer are formed of different materials from each other.

9. The nitride-based compound semiconductor light emitting device according to claim 2, wherein a side of the first bonding metal layer that bonds with the second bonding metal layer has a smaller surface area than a side of the first conductive substrate opposite the first bonding metal layer.

* * * * *